United States Patent
Wang et al.

(10) Patent No.: US 10,090,831 B2
(45) Date of Patent: Oct. 2, 2018

(54) METHOD FOR ELECTRICALLY AGING A PMOS THIN FILM TRANSISTOR

(71) Applicants: BOE TECHNOLOGY GROUP CO., LTD., Beijing (CN); ORDOS YUANSHENG OPTOELECTRONICS CO., LTD., Ordos, Inner Mongolia (CN)

(72) Inventors: Jun Wang, Beijing (CN); Xinxin Jin, Beijing (CN); Liang Sun, Beijing (CN); Yuebai Han, Beijing (CN); Guoqing Zhang, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 26 days.

(21) Appl. No.: 15/122,389

(22) PCT Filed: Apr. 9, 2015

(86) PCT No.: PCT/CN2015/076177
§ 371 (c)(1),
(2) Date: Aug. 29, 2016

(87) PCT Pub. No.: WO2016/110015
PCT Pub. Date: Jul. 14, 2016

(65) Prior Publication Data
US 2017/0302265 A1  Oct. 19, 2017

(30) Foreign Application Priority Data

Jan. 8, 2015  (CN) .......................... 2015 1 0008404

(51) Int. Cl.
*G09G 3/3233* (2016.01)
*H03K 17/16* (2006.01)

(52) U.S. Cl.
CPC .......... *H03K 17/16* (2013.01); *G09G 3/3233* (2013.01); *G09G 2300/0833* (2013.01); *G09G 2310/0289* (2013.01); *G09G 2310/08* (2013.01)

(58) Field of Classification Search
CPC ..... G09G 2320/043–2320/048; G09G 3/3258; G09G 3/3233; H03K 17/16
(Continued)

(56) References Cited

U.S. PATENT DOCUMENTS 5,274,601 A     12/1993 Kawahara et al.
2005/0174311 A1  8/2005 Huh et al.
(Continued)

FOREIGN PATENT DOCUMENTS

| CN | 101278248 A | 10/2008 |
|---|---|---|
| CN | 101593758 A | 12/2009 |
| JP | 2005223347 A | 8/2005 |

OTHER PUBLICATIONS

Office Action in Chinese Application No. 201510008404.X dated Feb. 28, 2017, with English translation. 11 pages.
(Continued)

*Primary Examiner* — Michael Pervan
(74) *Attorney, Agent, or Firm* — Womble Bond Dickinson (US) LLP

(57) ABSTRACT

The present disclosure relates to a method of electrically aging a PMOS thin film transistor. The method includes applying a first voltage Vg with an amplitude of A volts to a gate of the PMOS thin film transistor; applying a second voltage Vs with an amplitude of (A−40) to (A−8) volts to a source of the PMOS thin film transistor; and applying a third
(Continued)

voltage Vd with an amplitude of (A−80) to (A−16) volts to a drain of the PMOS thin film transistor. Application of the first voltage Vg, the second voltage Vs and the third voltage Vd is maintained for a predetermined time period, and Vd−Vs<0. In this way, reduction of a leakage current of the PMOS thin film transistor is achieved without changing a structural design of the thin film transistor.

14 Claims, 4 Drawing Sheets

(58) Field of Classification Search
USPC .................................................... 345/76–83
See application file for complete search history.

(56) References Cited

U.S. PATENT DOCUMENTS

2006/0273345 A1    12/2006  Lee et al.
2009/0295699 A1*   12/2009  Korenari ............ H01L 27/1214
                                              345/92

OTHER PUBLICATIONS

International Search Report dated Oct. 15, 2015, PCT Application No. PCT/CN2015/076177.
"Supplementary European Search Report," EP Application No. 15876523 dated Jun. 14, 2018.

* cited by examiner

METHOD FOR ELECTRICALLY AGING A PMOS THIN FILM TRANSISTOR

CROSS-REFERENCE TO RELATED APPLICATIONS

The present application is the U.S. national phase entry of PCT/CN2015/076177, with an international filing date of Apr. 9, 2015, which claims the benefit of Chinese Patent Application No. 201510008404.X, filed on Jan. 8, 2015, the entire disclosures of which are incorporated herein by reference.

TECHNICAL FIELD

The present disclosure relates to the field of display technology, and specifically to a method of electrically aging a PMOS thin film transistor (TFT), and further to a method of electrically aging at least one PMOS thin film transistor in an application circuit.

BACKGROUND

Display panels such as liquid crystal displays (LCDs) and active matrix organic light-emitting diode (AMOLED) displays are extensively applied in various electronic devices. A great number of PMOS thin film transistors exist in a backplane of the display panel, and low-temperature polysilicon (LTPS) technology is popular due to advantages of the resultant thin film circuit such as a small thickness, a small area and low power consumption. However, the PMOS thin film transistor generally has a large leakage current, which is unfavorable to the performance of the LCD or AMOLED display. In particular, since the thin film transistors in the pixel circuit of the AMOLED display panel are usually PMOS TFTs, the leakage current of the PMOS TFT has a larger impact on the performance of the AMOLED display panel. For example, the leakage current may cause occurrence of bright spots and light leakage when it exceeds a certain value.

At present, the leakage current of the PMOS thin film transistor may generally be reduced by improving the structure of the thin film transistor, for example, by employing a dual-gate TFT, reducing a channel width of the TFT, or increasing a channel length of the TFT. However, employing the dual-gate TFT or increasing the channel length of the TFT increases the size of the TFT, and the TFT can only allow for a small reduction in the channel width due to limitations of the size of the silicon crystal (especially the low-temperature polysilicon (LTPS)). In one word, these methods are not conducive to design-flexibility and integration of the thin film transistors, and especially cannot easily be adapted to the complicated pixel circuit in the AMOLED display panel.

Therefore, there is a need for an improved method of reducing the leakage current of the PMOS TFT and a method of reducing the leakage current of at least one PMOS thin film transistor in an application circuit, especially in an AMOLED pixel circuit.

SUMMARY

It would be desirable to achieve a method of reducing a leakage current of a PMOS thin film transistor without changing the structural design of the thin film transistor. It would also be desirable to provide a method of reducing a leakage current of at least one PMOS thin film transistor in an application circuit without changing the structural design of the application circuit.

It is noted that through a lot of experiments, the inventor has the insight that the leakage current of the PMOS thin film transistor may be effectively reduced by electrically aging the thin film transistor. Therefore, to better address one or more of these concerns, a method of electrically aging a PMOS thin film transistor is provided in a first aspect of the present disclosure. The method comprises applying a first voltage Vg with an amplitude of A volts to a gate of the PMOS thin film transistor; applying a second voltage Vs with an amplitude of (A−40) to (A−8) volts to a source of the PMOS thin film transistor; and applying a third voltage Vd with an amplitude of (A−80) to (A−16) volts to a drain of the PMOS thin film transistor. Application of the first voltage Vg, the second voltage Vs and the third voltage Vd is maintained for a predetermined time period, and Vd−Vs<0. Since only specific voltage signals are applied to the thin film transistor, reduction of the leakage current is achieved without changing the design of the PMOS TFT.

Optionally, the predetermined time period is greater than or equal to 1 second. Optionally, the predetermined time period is smaller than or equal to 300 seconds.

Optionally, Vd−Vs=Vds which is −25 to −12 volts, and Vg−Vs=Vgs which is 12 to 25 volts.

Optionally, each of the first voltage Vg, the second voltage Vs and the third voltage Vd is a constant voltage or a pulse voltage sequence having a predetermined duty cycle.

Optionally, when each of the first voltage Vg, the second voltage Vs and the third voltage Vd is the pulse voltage sequence having the predetermined duty cycle, the predetermined time period is a sum of pulse widths of the pulse voltage sequence.

Optionally, the PMOS thin film transistor is a low-temperature polysilicon (LTPS) PMOS thin film transistor.

According to a second aspect of the present disclosure, a method of electrically aging at least one PMOS thin film transistor in an application circuit is provided. The method comprises determining, based on the voltage amplitudes used in the method of electrically aging a PMOS thin film transistor as recited in the first aspect, for each of the at least one PMOS thin film transistor amplitudes of a respective set of operation signals required by the application circuit when the voltage amplitudes are satisfied; generating the respective set of operation signals for each of the at least one PMOS thin film transistor that satisfy the determined amplitudes; and applying respectively the respective generated sets of operation signals to the application circuit, to electrically age the at least one PMOS thin film transistor individually. Each set of operation signals is applied to the application circuit so that application of the first voltage Vg, the second voltage Vs and the third voltage Vd to a respective PMOS thin film transistor is maintained for the predetermined time period. Since only a specific voltage signal is applied to the application circuit, reduction of the leakage current of the at least one PMOS thin film transistor in the application circuit is achieved without changing the structural design of the application circuit.

Optionally, the respective sets of operation signals for the at least one PMOS thin film transistor are sequentially applied to the application circuit.

Optionally, two of the sets of operation signals are temporally separated.

Optionally, the respective sets of operation signals for the at least one PMOS thin film transistor are applied to the application circuit in a time-divisional manner.

Optionally, the method further comprises pre-determining whether each of the at least one PMOS thin film transistor in the application circuit needs to be electrically aged, whereby only those needing to be aged in the application circuit are electrically aged.

Optionally, determining whether the PMOS thin film transistor needs to be aged is based on an ON-OFF time ratio of the PMOS thin film transistor when the application circuit is in normal operation. Since the leakage current is generated only when the transistor is in a turned-off state, the leakage current of those transistors which stay turned on for a long time period may be neglected, and therefore electrical aging need not be performed.

Optionally, it is determined that the PMOS thin film transistor need not be aged when the ON-OFF time ratio of the PMOS thin film transistor is greater than a predetermined threshold.

Optionally, the application circuit is an AMOLED pixel circuit.

Optionally, the generated operation signals have the same time sequence as signals enabling the AMOLED pixel circuit to operate normally.

These and other aspects of the present disclosure will be apparent from and elucidated with reference to the embodiment(s) described hereinafter.

DETAILED DESCRIPTION

Embodiments of the present disclosure will be described in detail with reference to the drawings.

Figure 1:
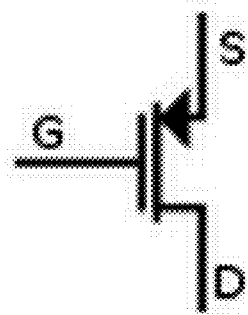
FIG. 1 schematically illustrates a circuit symbol of a PMOS thin film transistor.

FIG. 1 schematically illustrates a circuit symbol of a PMOS thin film transistor. As shown in the figure, the PMOS thin film transistor is a triple-terminal device, wherein G denotes a gate, S denotes a source and D denotes a drain. When a gate-source voltage Vgs (namely, Vg-Vs) is greater than a threshold voltage, the PMOS thin film transistor turns off. In this case, a leakage current $T_{off}$ exists between the drain and the source. When the gate-source voltage Vgs is lower than the threshold voltage, the PMOS thin film transistor operates, with a voltage of the source being higher than a voltage of the drain. Holes, which are carriers, flow from the source to the drain through a channel region.

According to an embodiment of the present disclosure, a method of electrically aging a PMOS thin film transistor may comprise: applying a first voltage Vg with an amplitude of A volts to the gate of the PMOS thin film transistor; applying a second voltage Vs with an amplitude of (A−40) to (A−8) volts to the source of the PMOS thin film transistor; and apply a third voltage Vd with an amplitude of (A−80) to (A−16) volts to the drain of the PMOS thin film transistor. Application of the first voltage Vg, the second voltage Vs and the third voltage Vd is maintained for a predetermined time period, and Vd−Vs<0.

In this embodiment, electrical aging simulation tests may be performed for an individual PMOS thin film transistor for example in a Test Element Group (TEG) region of a display panel by using a probe station device. The results of the tests show that an effect of reducing the leakage current $I_{off}$ may be achieved under the above-mentioned voltage amplitude conditions. In an example, the predetermined time period may be for example smaller than or equal to 300 seconds. It should be appreciated that the amplitude A of the gate voltage Vg, the ranges of the source voltage Vs and the drain voltage Vd, and the predetermined time period in which the voltages Vg, Vs and Vd are applied, are related to factors such as intrinsic properties (e.g., voltage bearing capability) of the PMOS thin film transistor and a desired magnitude of the leakage current. In the test environment, although the electrical aging effect might also be achieved with voltages falling outside the above-mentioned ranges of voltage, it is likely that an irreversible damage (e.g., breakdown) will be caused to the PMOS thin film transistor. In view of differences in properties of individual PMOS thin film transistors due to for example the fabrication process, the above-mentioned ranges of voltage are relatively safe. Such consideration is particularly important for an application where the electrical aging needs to be performed for millions of PMOS thin film transistors.

Figure 2A:
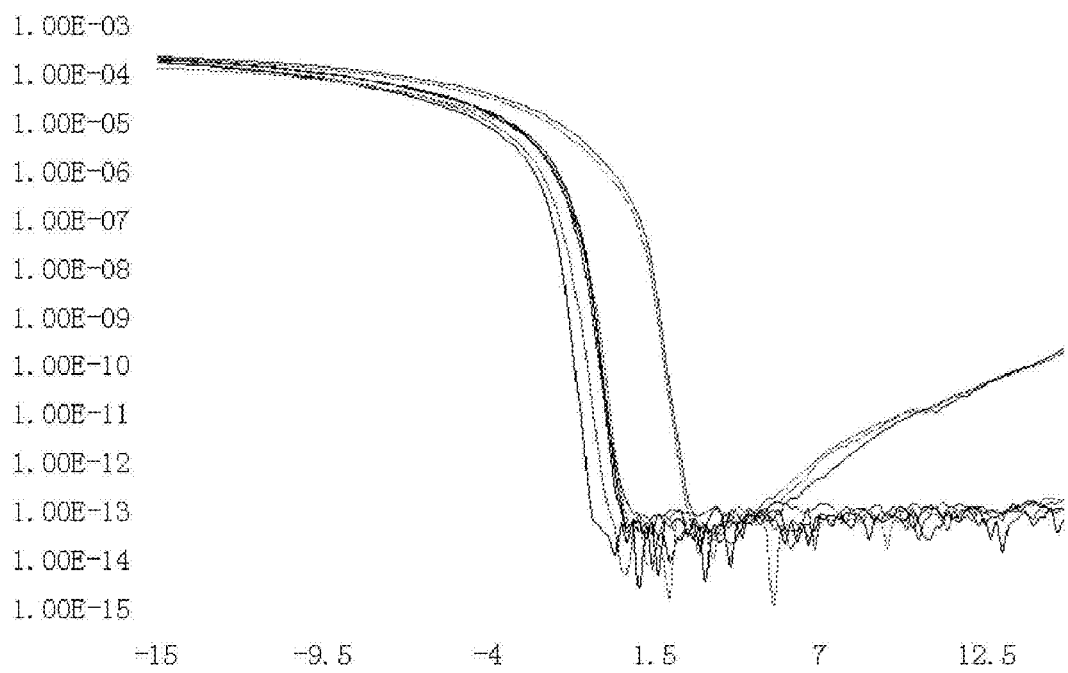
FIG. 2(a) shows contrasts of the leakage currents of a plurality of PMOS thin film transistors before and after being electrically aged individually according to an embodiment of the present disclosure.
Figure 2B:
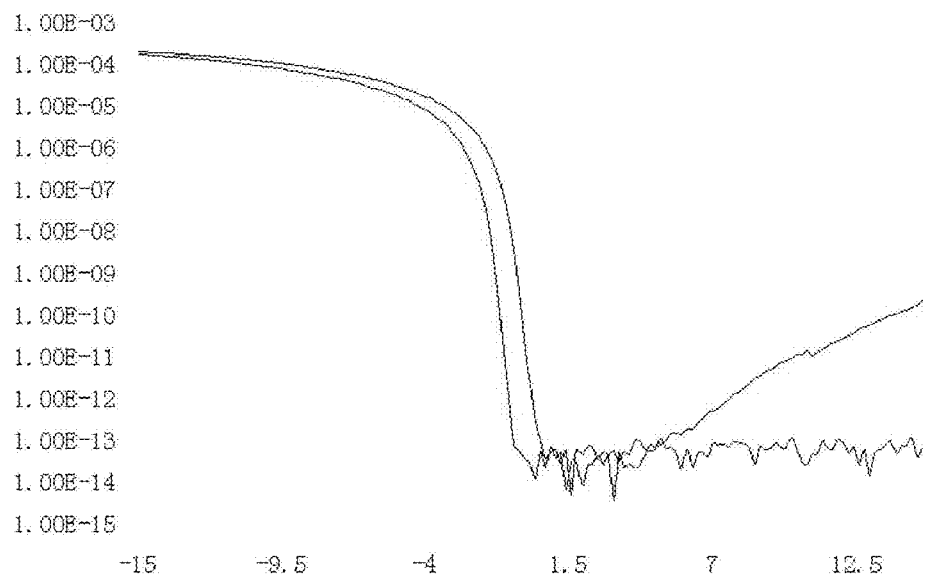
FIG. 2(b) shows a contrast of the leakage currents of one of the PMOS thin film transistors used in FIG. 2(a) before and after being electrically aged.

FIG. 2(a) shows contrasts of the leakage currents of a plurality of PMOS thin film transistors before and after being electrically aged individually according to an embodiment of the present disclosure. In the figure, the horizontal coordinates denote values of Vg (in volts) and the vertical coordinates denote values of a current Ids (in amperes) between the drain and the source. Data shown in the figure are measured under the condition that Vs=0 volts and Vd=−10 volts. For the sake of clarity, FIG. 2(b) shows a contrast of the leakage currents of one of the PMOS thin film transistors used in FIG. 2(a) before and after being electrically aged. It can be seen that in this example, with the electrical aging method according to the embodiment of the present disclosure being employed, the leakage current of the PMOS thin film transistor is substantially reduced as compared with that before the performance of the electrical aging.

Especially, it has been determined after tests that when Vds (namely, Vd-Vs) takes a value between −25 volts and −12 volts, Vgs (namely, Vg-Vs) takes a value between 12 volts and 25 volts, and the predetermined time period is greater than or equal to 1 second, good suppression of the leakage current can be achieved, and meanwhile the PMOS thin film transistor also has a high safety margin.

Note that in addition to being a constant voltage, each of the first voltage Vg, the second voltage Vs and the third voltage Vd may also be a pulse voltage sequence having a predetermined duty cycle. In this case, the predetermined time period in which the voltages are applied refers to a sum of pulse widths of the pulse voltage sequence. Furthermore, in an example, the PMOS thin film transistor may be a low-temperature polysilicon (LTPS) PMOS thin film transistor.

The above embodiments focus on electrically aging an individual PMOS thin film transistor. However, in practice, especially in a display panel, the PMOS thin film transistor usually does not take the form of a single discrete element, but exists in a complicated application circuit, for example a pixel circuit.

According to another embodiment of the present disclosure, a method is proposed for electrically aging at least one PMOS thin film transistor in an application circuit. A fundamental principle of the method is to age a specific PMOS thin film transistor in the application circuit by satisfying the voltage amplitude conditions for electrically aging an individual PMOS thin film transistor as stated above.

Specifically, the method may comprise: determining, based on the voltage amplitudes used in the method of electrically aging a PMOS thin film transistor as described in the above embodiments, for each of the at least one PMOS thin film transistor amplitudes of a respective set of operation signals required by the application circuit when the voltage amplitudes are satisfied; generating the respective set of operation signals for each of the at least one PMOS thin film transistor that satisfy the determined amplitudes; and applying respectively the respective generated sets of operation signals to the application circuit, to electrically age the at least one PMOS thin film transistor individually. Each set of operation signals is applied to the application circuit so that application of the first voltage Vg, the second voltage Vs and the third voltage Vd to a respective PMOS thin film transistor is maintained for the predetermined time period.

As stated in the previous embodiments, conditions for electrical aging mainly involve the voltage amplitudes, so the "operation signals" here are not intended to refer to any specific signals. They may be signals enabling the application circuit to operate normally or signals dedicated for aging treatment, so long as the above-mentioned voltage amplitude conditions for aging the PMOS thin film transistor in the application circuit can be satisfied.

The present embodiment will be described in detail below by taking an AMOLED pixel circuit as an example with reference to FIG. 3, FIG. 4, FIG. 5 and FIG. 6.

Figure 3:
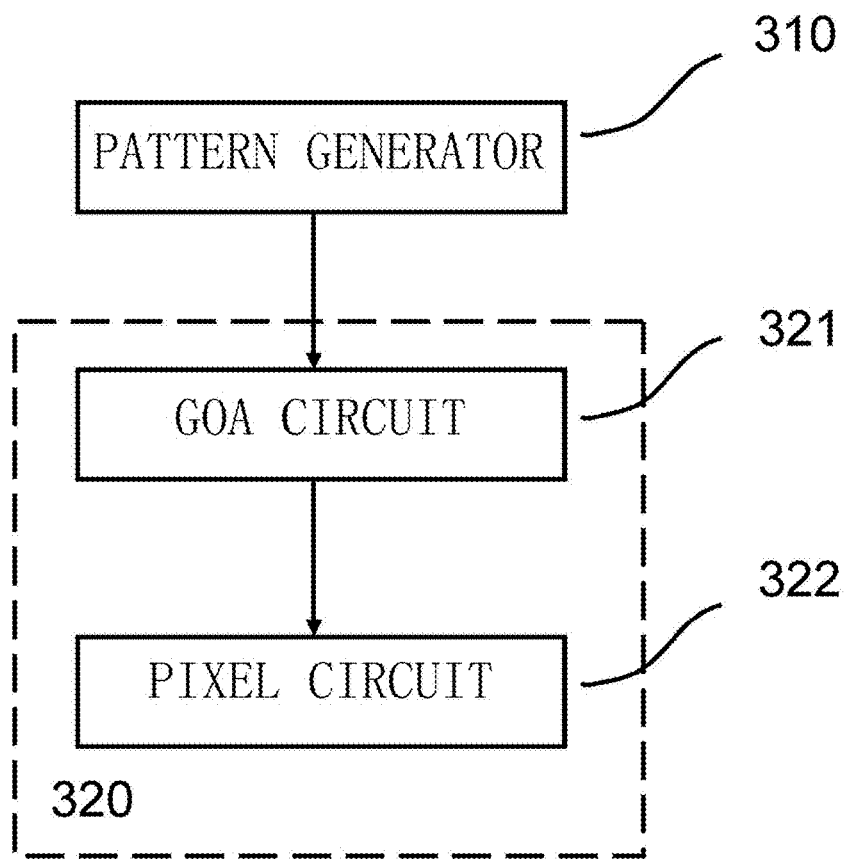
FIG. 3 schematically illustrates a system block diagram of an AMOLED display panel in a test environment.

FIG. 3 schematically illustrates a system block diagram of an AMOLED display panel in a test environment. A pattern generator (PG) 310 may provide the AMOLED display panel 320 with PG signals including variable voltage levels and time sequence signals to perform tests of the panel for example. The AMOLED display panel 320 comprises a GOA circuit 321 and a pixel circuit 322. A part of the PG signals provided by the pattern generator 310 are converted to GOA output signals via the GOA circuit 321. The GOA output signals may be applied to the gates of respective PMOS thin film transistors in the pixel circuit 322 for gate driving. The pixel circuit 322 may operate normally under joint action of the GOA output signals and of other operation signals provided by the pattern generator 310.

Figure 4:
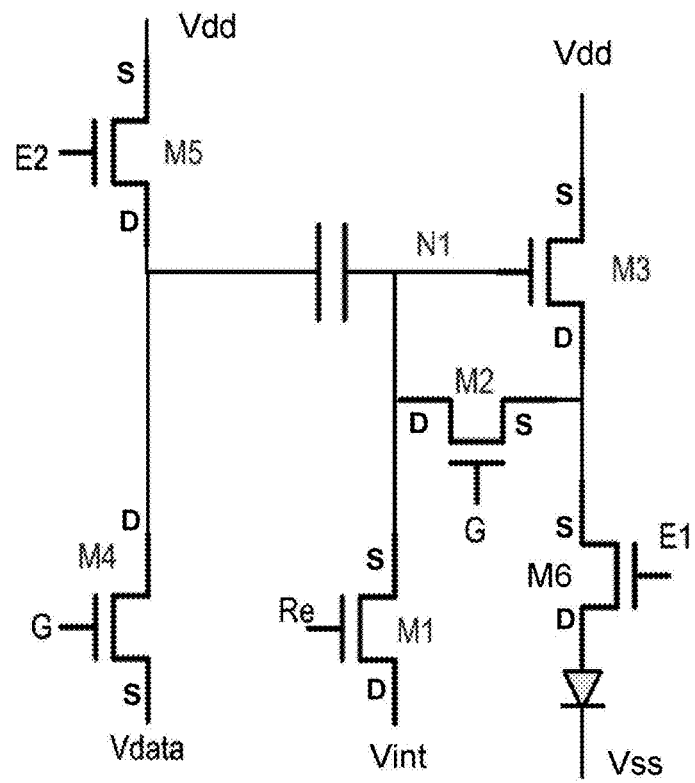
FIG. 4 schematically illustrates a circuit diagram of a pixel circuit in an AMOLED display panel.
Figure 5:
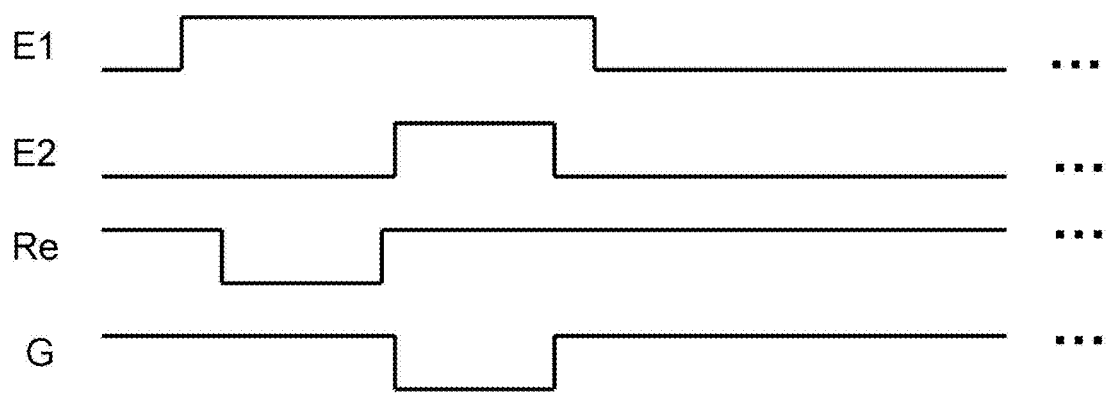
FIG. 5 schematically illustrates Gate Driver on Array (GOA) output signals for the AMOLED pixel circuit of FIG. 4 when it is in normal operation.

FIG. 4 schematically illustrates a circuit diagram of a pixel circuit in an AMOLED display panel (5-inch AMOLED CV 6T1C from BOE). In this figure, M1-M6 are PMOS thin film transistors. FIG. 5 schematically illustrates GOA output signals for the AMOLED pixel circuit of FIG. 4 when it is in normal operation. As shown in the figures, E1 is a gate signal of M6, E2 is a gate signal of M5, Re is a gate signal of M1, and G is a gate signal of M2 and M4. The gate signal of M3 is an intermediate signal generated inside the pixel circuit and has the same potential as node N1. It should also be appreciated that the waveform shown in FIG. 5 is only an example signal in a short time interval of a frame period.

For ease of description, assume that the voltage amplitudes for electrically aging an individual PMOS thin film transistor as stated above satisfies: Vds=−15v, and Vgs=15v, wherein the first voltage Vg=15v, the second voltage Vs=0v, and Vd=−15v. The aging is performed by employing operation signals (provided by the pattern generator 310 in FIG. 3, for example) which allow the pixel circuit to operate normally, with the exception that necessary modifications are made to their amplitudes (namely, the time sequences remain unchanged while the amplitudes are changed). Correspondingly, the high level Vh of the GOA output signals shown in FIG. 5 is set to 15v, such that the GOA output signals have a high level of Vh=15v. The voltage conditions to be satisfied for electrically aging the PMOS thin film transistors M1-M6 in the pixel circuit will be analyzed below in connection with such GOA output signals.

M1: Vd=Vint=−15v, and Vg=Vh=15v. In this case, it is required that Vdd=Vss=Vdata=0v. Vdd charges N1 with a potential of 0. Other signals may have normal signal values. Thus, a set of operation signals can be derived as pattern 1 for performing aging for M1.

M2: Vg=Vh=15v, Vs=Vdd=Vdata=0v, and Vd=Vint=−15v. To ensure turning on of M1, it is required that a low level V1=−20v. To prevent Vdata and Vss from affecting the potential of the source and drain of M2, it is required that Vss=Vdata=0v. Thus, a set of operation signals can be derived as pattern 2 for performing aging for M2.

M3: Vg=Vint=15v, Vs=Vdd=Vdata=0v, and Vd=Vss=−15v. V1=−20v to ensure turning on of M6. Other signals may have normal signal values. Thus, a set of operation signals can be derived as pattern 3 for performing aging for M3.

M4: Vs=Vdata=Vss=Vint=0v, Vg=Vh=15v, and Vd=Vdd=−15v. V1=−20v to ensure turning on of M2. Other signals may have normal signal values.

Thus, a set of operation signals can be derived as pattern 4 for performing aging for M4.

M5: In operation, the gate voltage E2 of M5 is at a low level in over 99% time of a frame period, so M5 almost remains completely turned on and therefore $T_{off}$ of M5 substantially has no contribution to light spots or light leakage.

M6: In operation, the gate voltage E1 of M6 is at a low level in over 99% time of a frame period, so M6 almost remains completely turned on and therefore $T_{off}$ of M6 substantially has no contribution to light spots or light leakage.

In the present example, since M5 and M6 are turned on in most time, light spots or light leakage caused by their leakage current $I_{off}$ may be neglected. Hence, the method according to the embodiment may comprise a step of pre-determining whether each of the at least one PMOS thin film transistor in the application circuit needs to be electrically aged, whereby aging is only performed for those PMOS thin film transistors which need to be aged. Thus unnecessary processing can be reduced. Specifically, since the leakage current $I_{off}$ exists only when the PMOS thin film transistor is in a turned-off state, the determination may be made based on an ON-OFF time ratio of the PMOS thin film transistor when the application circuit is in normal operation. When the ON-OFF time ratio of a PMOS thin film transistor is greater than a predetermined threshold, it is determined that this PMOS thin film transistor need not be aged. In this example, M5 and M6 are turned on over 99% of the time, so the predetermined threshold of the ON-OFF time ratio may be defined as 99.

Pattern 1, pattern 2, pattern 3 and pattern 4 corresponding to the PMOS thin film transistors M1-M4, respectively, are edited into the PG signals of the pattern generator. In the pattern generator, voltage amplitudes (e.g., Vint, Vdd, Vss in FIG. 4) for respective patterns may be set by using software of the pattern generator. Then, corresponding PG signals are generated and used for the AMOLED pixel circuit in FIG. 4.

With the time period in which each PMOS thin film transistor (which needs to be aged) is aged satisfying the predetermined time period, respective sets of operation signals may be sequentially applied to the application circuit in an embodiment. By way of example, and not limitation, two of the sets of operation signals are temporally separated, that is, after a first set of operation signals ends, a second set of operation signals may be applied after a certain time interval. In another embodiment, the respective sets of operation signals may be applied to the application circuit in a time-divisional manner. It should be appreciated that the so-called time division means that signals are divided in time, so the respective sets of operation signals do not overlap in the time axis. In addition, the embodiments are not intended to limit the time sequence in which the respective sets of operation signals are applied.

In the example, four sets of PG signals corresponding to M1, M2, M3 and M4 are respectively used for the AMOLED pixel circuit shown in FIG. 4, whereby electrical aging may be performed individually for M1, M2, M3 and M4 without affecting other PMOS thin film transistors.

Figure 6:
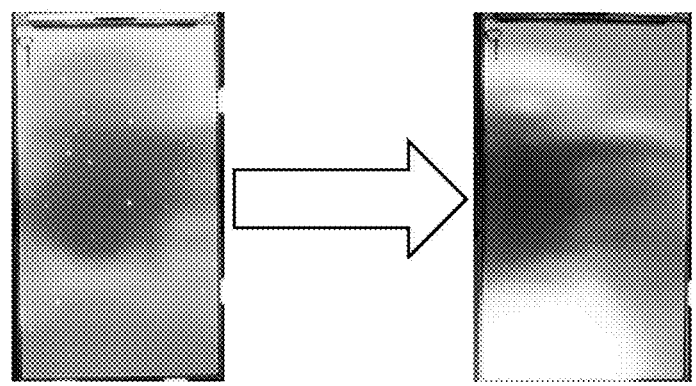
FIG. 6 shows a contrast of display effects of the AMOLED display panel before and after the pixel circuit of FIG. 4 is electrically aged.

FIG. 6 shows a contrast of display effects of the AMOLED display panel before and after the pixel circuit of FIG. 4 is electrically aged. As shown in the figure, after the electrical aging, light spots and light leakage of the AMOLED display panel are well suppressed. Hence, the effectiveness of the electrical aging method according to the embodiment of the present disclosure is verified.

While several specific implementation details are contained in the above discussions, these should not be construed as limitations on the scope of any disclosure or of what may be claimed, but rather as descriptions of features that may be specific to particular embodiments of particular disclosures. Certain features that are described in this specification in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations are to be performed in the particular order shown or in a sequential order, or that all illustrated operations are to be performed to achieve desirable results.

Various modifications, adaptations to the foregoing exemplary embodiments of this disclosure may become apparent to those skilled in the relevant arts in view of the foregoing description, when read in conjunction with the accompanying drawings. Any and all modifications will still fall within the scope of the non-limiting and exemplary embodiments of this disclosure. Furthermore, other embodiments of the disclosures set forth herein will come to mind to one skilled in the art to which these embodiments of the disclosure pertain having the benefit of the teachings presented in the foregoing descriptions and the associated drawings.

Therefore, it is to be understood that the embodiments of the disclosure are not to be limited to the specific embodiments disclosed and that modifications and other embodiments are intended to be included within the scope of the appended claims. Although specific terms are used herein, they are used in a generic and descriptive sense only and not for purposes of limitation.

What is claimed is:

1. A method of electrically aging a plurality of PMOS thin film transistors in an AMOLED pixel circuit, comprising:
   determining, for each of the plurality of PMOS thin film transistors, amplitudes of a respective set of operation signals required by the AMOLED pixel circuit when an aging voltage amplitude condition is satisfied, the aging voltage amplitude condition comprising: a first voltage Vg applied to a gate of the PMOS thin film transistor having an amplitude of A volts, a second voltage Vs applied to a source of the PMOS thin film transistor having an amplitude of (A−40) to (A−8) volts, and a third voltage Vd applied to a drain of the PMOS thin film transistor having an amplitude of (A−80) to (A−16) volts, wherein A is a number value and Vd−Vs<0;
   generating, for each of the plurality of PMOS thin film transistors, the respective set of operation signals that satisfies the determined amplitudes; and
   applying the generated respective sets of operation signals to the AMOLED pixel circuit to electrically age the plurality of PMOS thin film transistors individually, wherein each of the sets of operation signals is applied to the AMOLED pixel circuit so that application of the first voltage Vg, the second voltage Vs and the third voltage Vd to a respective one of the plurality of PMOS thin film transistors is maintained for a predetermined time period.

2. The method of claim 1, wherein the applying comprises sequentially applying the respective sets of operation signals to the AMOLED pixel circuit.

3. The method of claim 2, wherein the respective sets of operation signals are temporally separated.

4. The method of claim 1, wherein the applying comprises applying the respective sets of operation signals to the AMOLED pixel circuit in a time-divisional manner.

5. The method of claim 1, further comprising pre-determining whether each of the plurality of thin film transistors in the AMOLED pixel circuit needs to be electrically aged.

6. The method of claim 5, wherein the pre-determining comprises determining whether the PMOS thin film transistor needs to be aged based on an ON-OFF time ratio of the PMOS thin film transistor when the AMOLED pixel circuit is in normal operation.

7. The method of claim 6, wherein the pre-determining comprises determining that the PMOS thin film transistor need not be aged when the ON-OFF time ratio of the PMOS thin film transistor is greater than a predetermined threshold.

8. The method of claim 1, wherein each of the generated sets of operation signals has the same time sequence as signals enabling the AMOLED pixel circuit to operate normally.

9. The method of claim 1, wherein the predetermined time period is greater than or equal to 1 second.

10. The method of claim 9, wherein the predetermined time period is smaller than or equal to 300 seconds.

11. The method of claim 1, wherein (Vd−Vs) is in a range of −25 to −12 volts, and wherein (Vg−Vs) is in a range of 12 to 25 volts.

12. The method of claim 1, wherein each of the first voltage Vg, the second voltage Vs and the third voltage Vd is selected from the group consisting of a constant voltage and a pulse voltage sequence having a predetermined duty cycle.

13. The method of claim 12, wherein each of the first voltage Vg, the second voltage Vs and the third voltage Vd is the pulse voltage sequence having the predetermined duty cycle, and wherein the predetermined time period is a sum of pulse widths of the pulse voltage sequence.

14. The method of claim 1, wherein each of the plurality of PMOS thin film transistors is a low-temperature polysilicon (LTPS) PMOS thin film transistor.

* * * * *